(12) United States Patent
Beer

(10) Patent No.: US 6,829,185 B2
(45) Date of Patent: Dec. 7, 2004

(54) METHOD FOR PRECHARGING MEMORY CELLS OF A DYNAMIC SEMICONDUCTOR MEMORY DURING POWER-UP AND SEMICONDUCTOR MEMORY

(75) Inventor: Peter Beer, Tutzing (DE)

(73) Assignee: Infineon Technologies AG, Munich (DE)

(*) Notice: Subject to any disclaimer, the term of this patent is extended or adjusted under 35 U.S.C. 154(b) by 9 days.

(21) Appl. No.: 10/289,913

(22) Filed: Nov. 7, 2002

(65) Prior Publication Data
US 2003/0086322 A1 May 8, 2003

(30) Foreign Application Priority Data
Nov. 7, 2001 (DE) .......................................... 101 54 613

(51) Int. Cl.⁷ ................................................. G11C 7/00
(52) U.S. Cl. ...................... 365/203; 365/222; 365/226; 365/228
(58) Field of Search ............................... 365/203, 222, 365/226, 228

(56) References Cited

U.S. PATENT DOCUMENTS 5,339,274 A * 8/1994 Dhong et al. ............... 365/203
6,198,677 B1 * 3/2001 Hsu et al. ................... 365/203
6,282,135 B1   8/2001 Proebsting .................. 365/203
2002/0009008 A1 * 1/2002 Ferrant ....................... 365/203

* cited by examiner

Primary Examiner—Van Thu Nguyen
Assistant Examiner—Pho M. Luu
(74) Attorney, Agent, or Firm—Laurence A. Greenberg; Werner H. Stemer; Ralph E. Locher

(57) ABSTRACT

In a semiconductor memory, during the rewriting of the signal stored in a memory cell, a displacement current is produced in the cell capacitor, which has to be supplied by an on-chip plate generator. If a very large number of cell capacitors are simultaneously subjected to charge reversal, as may be necessary in particular during power-up, then the plate generator cannot supply the required current within the predetermined time window. Therefore, the memory cells can assume undesired, incorrect values. It is proposed to precharge the memory cells to a predetermined potential during the switch-on of the operating voltage. Therefore, the displacement current is reduced overall, so that the plate generator can apply the required current for charging the memory cells. This measure prevents a change to the cell contents using simple measures.

10 Claims, 1 Drawing Sheet

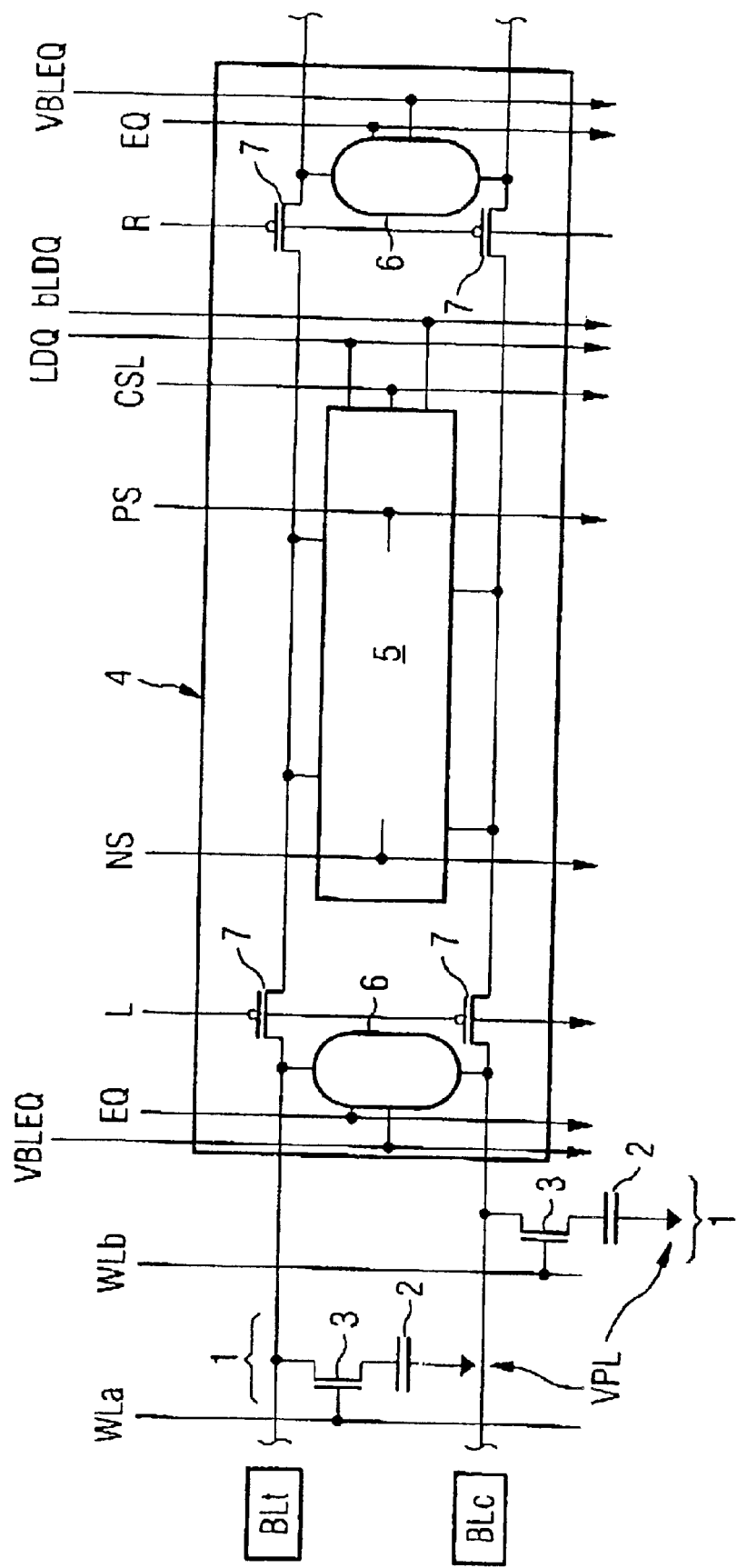

METHOD FOR PRECHARGING MEMORY CELLS OF A DYNAMIC SEMICONDUCTOR MEMORY DURING POWER-UP AND SEMICONDUCTOR MEMORY

BACKGROUND OF THE INVENTION

Field of the Invention

The invention is based on a method for precharging memory cells of a dynamic semiconductor memory and on a semiconductor memory of the generic type. In dynamically clocked semiconductor memories, the problem can arise that the charges (information) stored in the memory cells are not renewed (refreshed) as expected in particular when the operating voltage is switched on (power-up). This may be the case particularly when a very large number of memory cells have to be simultaneously subjected to charge reversal.

This memory behavior is caused by the fact that the required charging current cannot be applied by the plate generator simultaneously for all or for the majority of the memory cells. Each memory cell is formed with a small cell capacitor (plate capacitor) integrated in the substrate of the semiconductor memory. When rewriting the cell contents, therefore, it is also necessary to change the charge of the cell capacitors in the substrate. If the sign of these charges is not distributed statistically uniformly, but rather is so pronounced that the same voltage is written to the majority of the memory cells, then there is a significant charge entry into the counter electrode of the cell capacitors, the so-called plate. The charge entry alters the plate voltage, which entails a corresponding displacement current. The displacement current has to be compensated for by the on-chip voltage supply system for the plate voltage, in this case by the plate generator.

The magnitude of the displacement current can easily be calculated since the displacement current is proportional to the number of memory cells to be subjected to charge reversal that are to be subjected to charge reversal within a unit of time.

The performance of the plate generator is generally optimized in such a way that it can supply all the displacement currents that occur in normal operation of the semiconductor memory. Larger dimensioning would have the disadvantage of requiring a larger chip area for the realization, which would accordingly drive up the fabrication costs. Therefore, for the dimensioning of the plate generator, the performance is defined according to the maximum current occurring in regular operation, which current can be determined by the number of memory cells, the size of the cell capacitors, the charging time constant and the maximum voltage swing that occurs.

Thus, by way of example, in the case of an SDRAM having 16 memory cells to be subjected to charge reversal each with a capacitance of 40 fF, a current of 115 $\mu$A flows given a charging time of 10 ns and a voltage swing of 0 to 1.8 volts.

In a special case, changed conditions are present directly after the switch-on (power-up) of the operating voltage. In this case, all the memory cells of the semiconductor memory are capacitively raised to the plate voltage of 0.9 volts during charging of the plate with the corresponding cell capacitors, in order to remain at the example mentioned above.

If, before the cells are written to, first a refresh of the memory cells is carried out, then the assigned sense amplifier interprets, for example, a voltage of 0.9 volt as logic 1 and then attempts, for example, to charge all the memory cells to the operating voltage of 1.8 volts, for example. Since, by way of example, in the case of an SDRAM memory PC 100 having 32 k memory cells, with 70 ns, the refresh proceeds much faster than a write operation, the current to be supplied by the plate generator rises in an extreme fashion. Thus, in this case, by way of example, with the SDRAM having 32 k memory cells each of 40 fF and a voltage swing of 0.9 to 1.8 volts, a current of 16.8 A would become necessary.

A solution to this problem has not been disclosed heretofore. As already mentioned above, enlarging the plate generator would entail corresponding cost disadvantages. In contrast, if the plate generator is not enlarged, then the plate voltage can decrease during the refresh operation. During a subsequent write operation directly after the refresh operation, the amplitude of the cell signal decreases as a result, since the memory cells can no longer be charged to the full value of the supply or operating voltage.

If it is assumed, for example, that the plate has been charged to 1.8 volts during the refresh operation, then a voltage difference between the plate and the memory cell of 0 volts is obtained when writing a logic 1, which corresponds to the operating voltage of 1.8 volts. If the plate relaxes, that is to say discharges by the time of reading to 0.9 volt, then the memory cell is also discharged to 0.9 volt. At this limit value, it is then chance that decides whether the sense amplifier now interprets this value as logic 0 or 1. However, such uncertainty is undesirable and unacceptable to a user of the semiconductor memory.

SUMMARY OF THE INVENTION

It is accordingly an object of the invention to provide a method for precharging memory cells of a dynamic semiconductor memory during power-up and a semiconductor memory that overcome the above-mentioned disadvantages of the prior art methods and devices of this general type, in which an improved signal evaluation is made possible even in the case of extreme operating states.

With the foregoing and other objects in view there is provided, in accordance with the invention, a method for precharging memory cells of a dynamic semiconductor memory. The method includes controlling the memory cells disposed in rows and columns through use of word lines and bit lines, using sense amplifiers for reading out, amplifying and returning again information stored in the memory cells in a refresh cycle, and during a switch-on of an operating voltage, precharging the memory cells to a predetermined potential.

The inventive method has the advantage that the above-mentioned disadvantages can be avoided or cannot occur. In this case, it is regarded as particularly advantageous that the plate generator does not have to be amplified and yet can even supply the current flowing in the aforementioned special case after the power-up. What is also achieved by the improved evaluation of the cell signal in the case of a dynamic semiconductor memory is that the errors during reading are minimized and a higher reliability is thus obtained for the stored information.

It is regarded as particularly advantageous that the memory cells are precharged to 0 volts or alternatively to the potential of the operating voltage. The plate generator can advantageously be optimally dimensioned to these defined values taking account of the charging time, so that it is able to supply the required current for each operating mode.

A further alternative solution is also seen in the fact that approximately half of the memory cells are precharged to 0 volts and, respectively, approximately half of the memory cells are precharged to the operating voltage. This ensures that the average current becomes lower and, as a result, the plate generator can be further optimized.

It is expedient, moreover, to control the memory cells with the aid of the assigned sense amplifiers. This can be done in a simple manner by the signals on the control lines that control the sense amplifiers.

In principle, the memory cells can be controlled by the sense amplifiers in two advantageous ways. One expedient alternative is for the word lines to be activated, the two equalizers and the isolation switches of a sense amplifier to be conducting and switched off, respectively, the N-FET set signal to be switched to 0 volts and the P-FET set signal to be switched to the potential of the operating voltage. The selection signal (column select signal) is switched off. Thus, the sense amplifier has to decide the direction in which it toggles. Consequently, one half of the memory cells is precharged to the operating voltage and the other half of the memory cells is precharged to 0 volts (ground). As a result, the statistically average current that has to be supplied by the plate generator is relatively low.

The second alternative solution consists in the word lines are activate, the two equalizers being switched on, the bit lines thereof being put at 0 volts and at the potential of the operating voltage, respectively, and the isolation switches being turned off. This configuration isolates the interior of the sense amplifiers, so that signals cannot exercise any influence in the interior of the sense amplifiers. All the memory cells are then advantageously precharged to 0 volts and to the operating voltage VBLH, respectively.

In the case of the semiconductor memory, the application in a DRAM module is regarded as an advantageous solution since, with this type of memory, the memory cells require a cyclic refresh signal in the case of which the stored information is continuously read out and read in again in amplified fashion.

With the foregoing and other objects in view there is provided, in accordance with the invention, a semiconductor memory. The memory contains word lines having word line pairs, bit lines, a multiplicity of memory cells disposed in rows and columns and connected to and controlled by the word lines and the bit lines, and sense amplifiers. A respective word line pair is connected to a respective sense amplifier. Each of the sense amplifiers has two equalizers, four isolation switches, N-FET and P-FET switches, and set signals for the N-FET and P-FET switches. The sense amplifiers precharge the memory cells to an operating voltage or to 0 volts during a switch-on of the operating voltage.

Other features which are considered as characteristic for the invention are set forth in the appended claims.

Although the invention is illustrated and described herein as embodied in a method for precharging memory cells of a dynamic semiconductor memory during power-up and a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a circuit diagram of a detail of a memory cell array according to the invention.

DESCRIPTION OF THE PREFERRED EMBODIMENTS

Referring now to the single FIGURE of the drawing in detail, there is shown a detail of a memory cell array of the kind known as a dynamic random access memory (DRAM), for example. The memory cell array has memory cells 1 disposed in rows and columns and is part of a semiconductor memory configured as an integrated circuit.

The left-hand part of the figure illustrates, in a diagrammatic illustration, excerpts from two memory cells 1 of a DRAM that essentially have a cell capacitor 2 in each case. The cell capacitor 2 is configured as a plate capacitor 2 and integrated in a corresponding insulated well of the substrate of the integrated circuit. Its one plate is put at the potential of the plate (plate voltage VPL), which may be precharged for example to half the supply voltage VBLH/2=0.9 volt. The respective second terminals of the cell capacitors 2 are in each case connected to a main current path of a cell switch 3, which, on the one hand, can switch the stored potential of the plate capacitors 2 onto a bit line BLt (true) or onto a complementary bit line BLc (read cycle). On the other hand, the memory cells 1 or their plate capacitors 2 can be charged by a sense amplifier 4 to 0 volts or to the supply voltage VBLH, for example 1.8 volts, in the write cycle, as will be explained in more detail later.

The cell switches 3 are controlled via word lines WLa and WLb, respectively, which are controlled with a corresponding signal. The word line pairs WLa, WLb are routed in continuous fashion and control a very large number of the memory cells 1 with a corresponding large number of bit line pairs BLt, BLc. A sense amplifier 4 is connected for each bit line pair. For reasons of clarity, only two word lines WLa, WLb and bit lines BLc, BLt have been illustrated. The same also applies to the remaining control signals, which will be explained later.

The cell switches 3 used may be field-effect transistors (FETs) that are preferably of the N type. This transistor type may preferably be used for technical control and insulation reasons. However, P-type FET transistors can also be used.

The write/read operation of the memory cells 1 is controlled in the refresh cycle by the sense amplifier 4. The sense amplifier 4 essentially has two equalizers 6 and also a signal amplifier 5. The two equalizers have potential-controlled FET transistors that are controlled by two control lines EQ. Via their main current path, they can charge the bit lines BLc and BLt to the potential of the control voltage VBLEQ.

Connected between the two equalizers 6 is the signal amplifier 5, which can be isolated from the two bit lines BLc, BLt by a total of four isolation switches 7. The four isolation switches 7 are likewise configured as FET transistors and can be controlled by control signals L and R, respectively.

The signal amplifier 5 is controlled by a series of signals by which the individual functions for the write/read operation and for the refresh cycle can be carried out. It likewise has FET transistors configured as N-FET or as P-FET transistors in accordance with the requirements. Thus, by way of example, the bit line BLc or BLt can be set to ground potential by a set signal NS. On the other hand, a set signal PS puts the bit line BLc or BLt at the supply voltage VBLH.

Furthermore, a selection signal CSL is provided, by which the two bit lines BLt and BLc can be switched to the potentials LDQ and bLDQ, respectively. Via these lines, data can be conducted from the chip in the direction of the data outputs.

The method of operation of the sense amplifier 4 is explained in more detail below. The bit lines BLc, BLt are precharged with half the supply voltage VBLH/2 to the control voltage for the equalizer VBLEQ in accordance with the plate voltage VPL. Thus, in our example, VBLEQ= VBLH/2=VPL=0.9 volt. By activating a word line WLa, WLb, the charge of a memory cell 1 flows onto the corresponding bit line BLc or BLt. Through sequential application of the two set signals NS=VBLH=1.8 volts and PS=0 volts, the voltage difference arising between the two bit lines BLc and BLt is amplified and then written to the memory cells 1 again (refresh cycle).

As has already been explained, the problem has existed heretofore that, when the memory is switched on (power-up), there is not enough current available for simultaneously charging all the memory cells 1. In order to solve this problem, the invention proposes two alternative solutions by which all the memory cells 1 can be precharged either to the supply voltage VBLH or ground during power-up, without an over dimensioned plate generator being required.

A first exemplary embodiment proposes activating all the word lines WLa, WLb. In this case, the two word lines WLa, WLb depicted in the figure are only representative of all the word lines of the memory circuit.

The two equalizers 6 are switched off. Furthermore, the control signals L and R are switched in such a way that the isolation switches 7 are conducting, i.e. in the on state. The set signal NS for the N-FET switches is at ground, while the set signal PS for the P-FET transistors is at the supply voltage VBLH. The selection signal CSL is switched off. With this signal specification, the sense amplifier 4 has to make the decision to change over to one of the two possible potentials VBLH or ground. Consequently, during power-up, one half of the memory cells 1 is precharged to the supply voltage VBLH and the other half of the memory cells 1 is precharged to ground potential. With this configuration of the signals, the current to be applied by the plate generator becomes minimal.

An alternative solution of the invention proceeds as follows. Once again all the word lines WLa, WLb must be activated, as has already been described in the case of the first exemplary embodiment. The equalizer 6 is switched on. The control voltage VBLEQ for one equalizer 6 must be put at ground=0 volts and must be put at VBLH=1.8 volts for the other equalizer 6. The four isolation switches 7 are non-conducting, i.e. turned off. As a result, the interior of the sense amplifier 4, that is to say the signal amplifier 5, is isolated from the rest of the circuit, so that the signals in the interior of the signal amplifier 5 need no longer be taken into account since this part is no longer connected to the bit lines BLc, BLt. All the memory cells are then precharged to a predetermined potential, to the potential VBLH or ground during power-up.

Since there is very much time available for the power-up than in the case of the refresh cycle, the plate generator is able to supply the required charging current without there being a dip in the supply voltage.

The function of the plate generator is configuration for two cases, in principle. It must ensure that sufficient current is made available for the charge reversal of the memory cells from 1 to 0 or vice versa.

On the other hand, the memory cells lose their charge over time and have to be charged in a refresh cycle. On average, the memory cells lose 50 mV, for example, between two refresh cycles. In accordance with the current calculation specified in the introduction, a current of approximately 0.93 A results which has to be supplied by the plate generator. However, the plate generator would have to supply 16.8 A in the case of a refresh directly after power-up.

Therefore, according to the invention, during the relatively lengthy power-up, all the cells are brought to a 'valid' potential, to 0 volts or 1.8 volts. This is because in the long period of time even a weak plate generator can hold the plate at VPL=0.9 volt.

I claim:

1. A method for precharging memory cells of a dynamic semiconductor memory, which comprises the steps of:

controlling the memory cells disposed in rows and columns through use of word lines and bit lines;

using sense amplifiers for reading out, amplifying and returning again information stored in the memory cells in a refresh cycle; and during a switch-on of an operating voltage, precharging the memory cells to a predetermined potential.

2. The method according to claim 1, which comprises precharging the memory cells to 0 volts.

3. The method according to claim 1, which comprises precharging the memory cells to a potential of the operating voltage.

4. The method according to claim 1, which comprises precharing approximately half of the memory cells precharged to 0 volts and, respectively, precharing approximately half of the memory cells to the operating voltage.

5. The method according to claim 4, wherein the precharging step comprises using control lines for switching the sense amplifiers such that some of the memory cells are precharged to 0 volts and a remainder of the memory cells are precharged to the operating voltage.

6. The method according to claim 1, which comprises:

activating the word lines;

switching on two equalizers of each of the sense amplifiers;

switching off isolation switches of each of the sense amplifiers;

setting an N-FET set signal to 0 volts;

setting a P-FET set signal at a potential of the operating voltage; and switching off a selection signal.

7. The method according to claim 1, which comprises:

activating the word lines;

switching on two equalizers of each of the sense amplifiers, and putting the bit lines thereof at 0 volts and at the operating voltage, respectively; and switching on isolation switches of each of the sense amplifiers.

8. A semiconductor memory, comprising:

word lines having word line pairs;

bit lines;

a multiplicity of memory cells disposed in rows and columns and connected to and controlled by said word lines and said bit lines; and sense amplifiers, a respective word line pair connected to a respective sense amplifier, each of said sense amplifiers having two equalizers, four isolation switches, N-FET and P-FET switches, and set signals for said N-FET and P-FET switches, said sense amplifiers precharging said memory cells to one of an operating voltage and to 0 volts during a switch-on of the operating voltage.

9. The semiconductor memory according to claim 8, wherein said sense amplifiers precharge half of said memory cells to a value of the operating voltage and, respectively, half of said memory cells to 0 volts.

10. The semiconductor memory according to claim 8, wherein the semiconductor memory is a dynamic random access memory module.

* * * * *